United States Patent [19]
Tabata

[11] Patent Number: 4,558,457
[45] Date of Patent: Dec. 10, 1985

[54] COUNTER CIRCUIT HAVING IMPROVED OUTPUT RESPONSE

[75] Inventor: Toshio Tabata, Tokyo, Japan

[73] Assignee: Pioneer Electronic Corporation, Tokyo, Japan

[21] Appl. No.: 547,615

[22] Filed: Nov. 1, 1983

[30] Foreign Application Priority Data
Nov. 1, 1982 [JP] Japan .............................. 57-192888

[51] Int. Cl.⁴ ........................................... H03K 21/32
[52] U.S. Cl. .................................... 377/107; 377/111; 307/471
[58] Field of Search ............... 377/107, 111; 307/471; 328/20

[56] References Cited

U.S. PATENT DOCUMENTS

| | | |
|---|---|---|
| 3,632,997 | 1/1972 | Froemke .............................. 377/111 |
| 3,992,635 | 11/1976 | Suzuki et al. ....................... 377/111 |
| 4,132,905 | 1/1979 | Stein .................................... 307/471 |
| 4,236,114 | 11/1980 | Sasaki .................................. 307/471 |
| 4,406,014 | 9/1983 | Doron .................................. 377/111 |

Primary Examiner—John S. Heyman
Attorney, Agent, or Firm—Sughrue, Mion, Zinn, Macpeak & Seas

[57] ABSTRACT

An improved clock circuit in which a counter can begin its counting operation following the release of the reset signal always within one-half of the period of the input clock signal. The input clock signal is applied through a D-type flip-flop to one input of an exclusive-OR gate, and to the other input of the exclusive-OR gate directly. The output of the exclusive-OR gate drives the clock input to the counter. The clock input to the D-type flip-flop is supplied by the reset signal.

3 Claims, 11 Drawing Figures

COUNTER CIRCUIT HAVING IMPROVED OUTPUT RESPONSE

BACKGROUND OF THE INVENTION

The present invention relates to a counter circuit providing an improved resetting operation.

A conventional counter circuit is shown in FIG. 1. In this circuit, an input reset signal 1 and input clock signal 2 are fed to a counter 3 which produces a counter output 4. Two typical timing charts for the operation of this counter are shown in FIGS. 2 and 3. In either case, when the reset signal 1 changes from "1" to "0", the clock signal 2 rises and thereby causes the counter 3 to advance by one. As will be apparent by comparing FIGS. 2 and 3, the time t for the counter 3 to start counting after reset signal 1 has fallen to the "0" level can vary in the circuit configuration of FIG. 1, and in an extreme case, the time t can be equal to one time period of clock signal 2. Therefore the counter 3 may produce jitter for a duration substantially equal to the period of one clock period if the timing of the release (drop to the "0" level) of the reset signal 1 is poorly adjusted.

An improved counter circuit is shown in FIG. 4. In this circuit, the clock signal 2, before it is fed to the counter 3, is passed through a frequency multiplier 5 which doubles the clock pulse frequency. Two typical timing charts for the operation of this improved counter in response to the reset signal 1 are shown in FIGS. 5 and 6. From these figures, it can be that the maximum value of time t is only about one half that required for the circuit of FIG. 1. This means that the jitter period in the output of the counter 3 is limited to half the period of the clock signal. However, the circuit configuration of FIG. 4 cannot be used if the clock frequency is near the upper limit of the operating frequency of the counter.

SUMMARY OF THE INVENTION

Taking the above into consideration, the primary object of the present invention is to provide a counter circuit wherein the polarity of the clock signal, before it is fed into the counter, is manipulated so that the clock frequency is, in effect, doubled.

This object is achieved by a counter circuit wherein an input clock signal is fed to a counter through an exclusive-OR gate, and an input reset signal to the counter and the clock signal are fed to a flip-flop circuit, with an output signal from the flip-flop circuit being supplied as a gate signal from said exclusive-OR gate.

DESCRIPTION OF THE PREFERRED EMBODIMENTS

Figure 1:
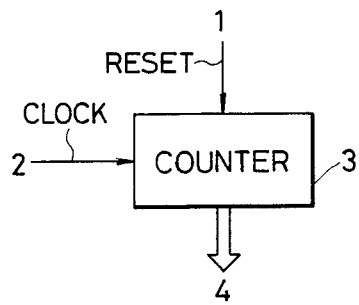
FIG. 1 is a schematic representation of a conventional counter circuit.
Figure 2:
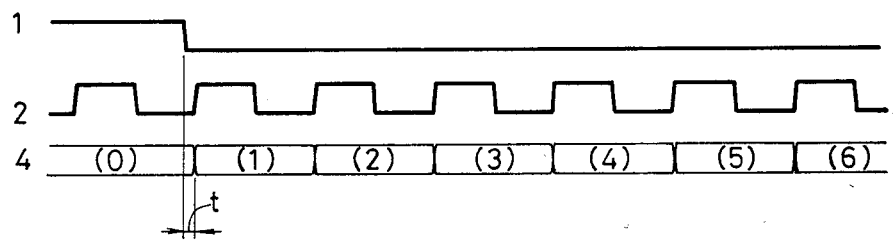
FIGS. 2 and 3 are timing charts for a description of the operation of the counter circuit of FIG. 1.
Figure 3:
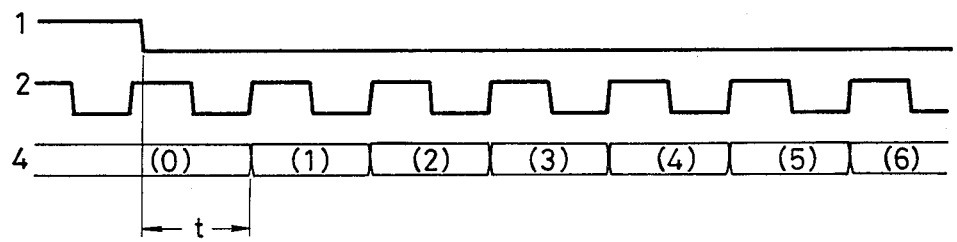
Figure 4:
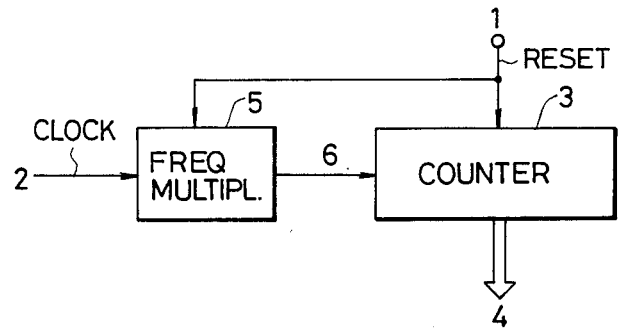
FIG. 4 is a schematic representation of another conventional counter circuit.
Figure 5:
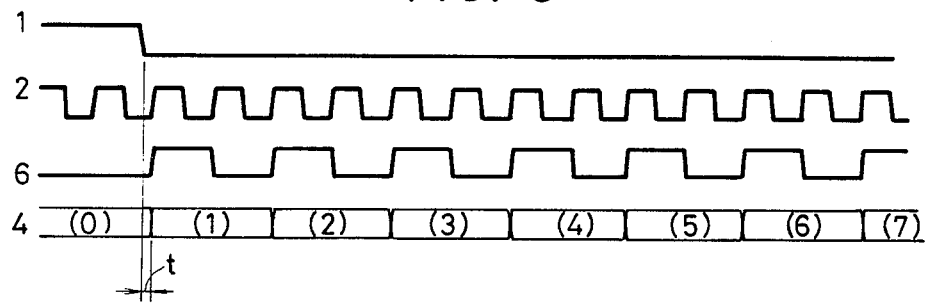
FIGS. 5 and 6 are timing charts for a description of the operation of the counter circuit of FIG. 4.
Figure 6:
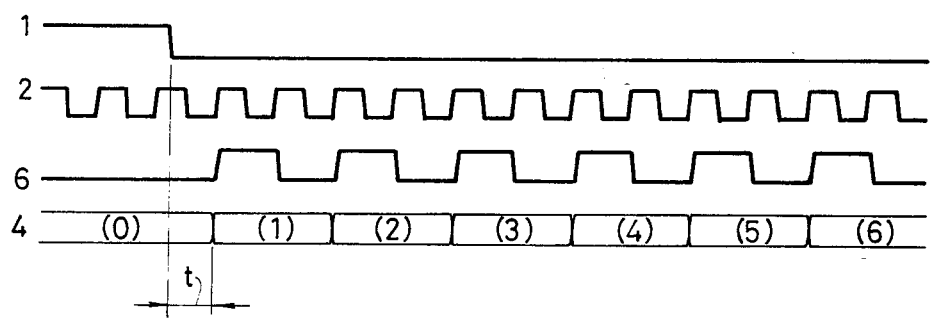

Preferred embodiments of the present invention are hereunder described with reference to FIGS. 7 to 10, wherein components or waveforms previously explained are identified by the same reference numerals as above.

Figure 7:
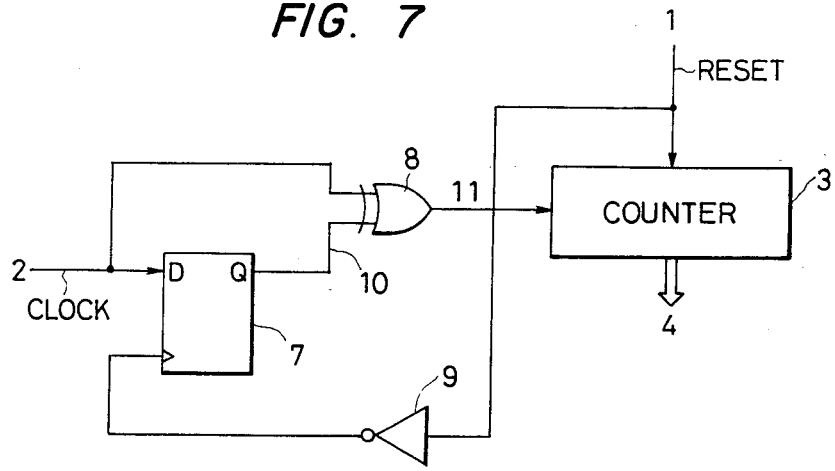
FIG. 7 is a circuit diagram of a counter circuit constructed according to a first preferred embodiment of the present invention.

In the circuit of FIG. 7, the input clock signal 2 is fed to the counter 3 through an exclusive-OR gate 8, whereas the input reset signal 1 is fed to the counter 3 through an inverter 9. The clock signal 2 is also directly fed to a flip-flop circuit 7, which in response produces an output signal 10 applied to one input of the exclusive-OR gate 8.

Figure 8:
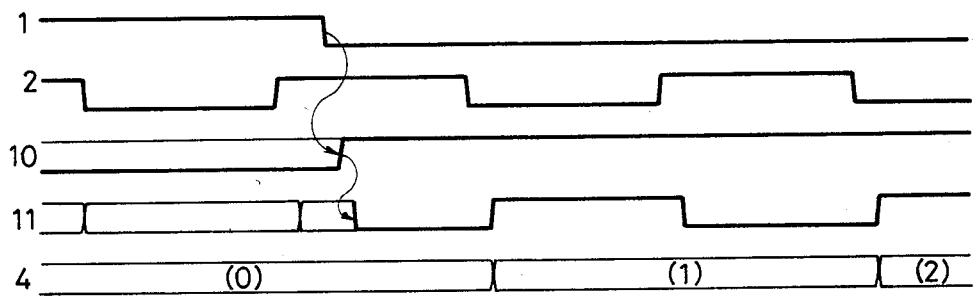
FIGS. 8 and 9 are timing charts for a description of the operation of the counter circuit of FIG. 7.

As shown in FIG. 8, if clock signal 2 is at the "1" level when the reset signal 1 is at the "1" level, the flip-flop circuit 7 latches the clock signal 2 to thus supply the exclusive-OR gate 8 with a "1" level output 10. In response to the clock signal 2 and the output signal 10, the exclusive-OR gate 8 produces an output signal 11 which, as shown in FIG. 8, appears as an inverted clock signal 2. In this case, the counter 3 starts its counting operation concurrently with the rise of the output signal 11, producing a counter output 4 having a waveform shown in FIG. 8. The counter output 4 assumes the "1" level when the first clock signal 2 that is generated after the fall of reset signal goes to "0". Therefore, the counter 3 produces a "1" level output half a clock period earlier than in the conventional case wherein the "1" level output is produced when the first pulse of the clock signal 2 is generated after the reset signal has risen to "1".

Figure 9:
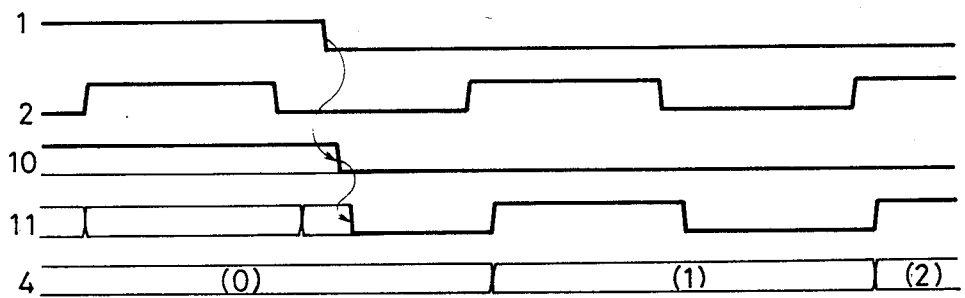
Figure 10:
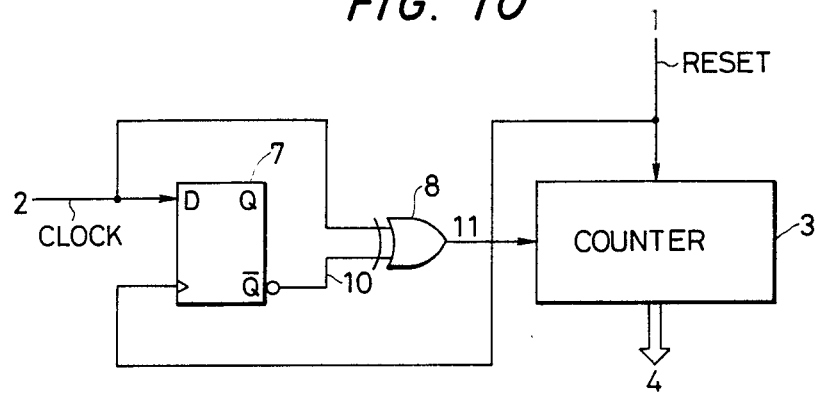
FIG. 10 is a circuit diagram of a counter circuit constructed according to another embodiment of the present invention.

If, as shown in FIG. 9, the clock signal 2 is at the "0" level when the reset signal 1 has fallen from "1" to "1", the flip-flop circuit 7 produces a "0" level output signal 10. In response to the clock signal 2 and the output signal 10, the exclusive-OR gate 8 produces an output signal 11 which, as shown in FIG. 9, is the same as the input clock signal 2. In this case too, the counter 3 starts the counting operation concurrently with the rising of the output signal 11, producing a counter output 4 having the waveform shown in FIG. 9. This counter output 4 assumes the "1" level when the first pulse of the clock signal 2 that is generated after the reset signal has risen to "1". Therefore, the counter 3 again produces a "1" level output half a clock period earlier than in the conventional case, thereby reducing the jitter duration by at least half a clock period.

As described above, the jitter duration can be reduced to at least half the clock period by manipulating the polarity of the clock signal 2 at the fall of the reset signal so that the input signal to counter 3 rises within half a clock period.

Figure 11:
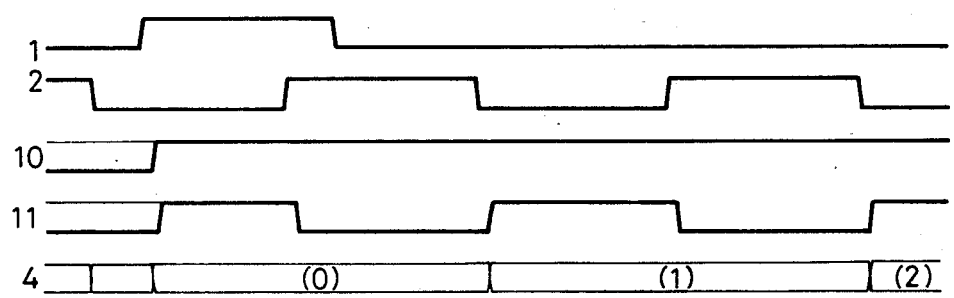
FIG. 11 is a timing chart for a description of the operation of the counter circuit of FIG. 10.

In the embodiment of FIG. 7, the reset signal 1 is fed to the flip-flop circuit 7 after it has been inverted by the inverter 9. This inverter may be eliminated, as has been done in the circuit of FIG. 10. If the pulse width of the reset signal is an integral multiple of half the period of the clock signal 2, the clock signal may be sampled at the rise of the reset signal 1 as shown in FIG. 11, rather than at the fall of the reset signal as in the embodiments of FIGS. 8 and 9. Therefore, the circuit of FIG. 10 can be used when the pulse width of the reset signal 1 is equal to half the period of the clock signal 2.

As described in the foregoing, the counter circuit of the present invention uses a flip-flop circuit and an exclusive-OR circuit to manipulate the polarity of clock signals so as to start the counter's operation within half the period of the clock signal following the fall of the reset signal. Because of this feature, the counter of the present invention produces a jitter having a maximum duration of only half the period of the clock signal. This is possible even if the clock frequency is close to the upper limit of the operating frequency of the counter. In other words, if a jitter of the same magnitude as produced in the conventional system can be tolerated, the counter of the present invention can be operated up to a frequency twice that heretofore possible. This permits the high-speed operation of CMOS integrated circuits and other devices which usually have low cut-off frequencies.

I claim:

1. An improved counter circuit in which a counter can begin its counting operation following the release of a reset signal within one half of the period of an input clock signal, comprising, an exclusive-OR gate coupled directly to an input clock signal, a counter, coupled to an output of said exclusive-OR gate, a flip-flop circuit having an input reset signal coupled to the counter through said flip-flop circuit, wherein said input clock signal is also inputted into said flip-flop circuit, and wherein an output signal from said flip-flop circuit is supplied as a gate signal for said exclusive-OR gate.

2. An improved counter circuit in which a counter can begin its counting operation following the release of a reset signal within one half of the period of an input clock signal, comprising: a counter having a reset terminal coupled to a reset signal line; a D-type flip-flop circuit having a D input coupled to a clock line signal; an inverter having an input coupled to said reset signal line and an output coupled to a clock input of said flip-flop circuit; and an exclusive-OR gate having a first input coupled to said clock line, a second input coupled to a Q output of said flip-flop circuit, and an output coupled to a clock terminal of said counter.

3. An improved counter circuit in which a counter can begin its counting operation following the release of a reset signal within one half of the period of an input clock signal, comprising: a counter having a reset terminal coupled to a reset signal line; a D-type flip-flop circuit having a clock input terminal coupled to said reset signal line and a D input coupled to a clock signal line; and an exclusive-OR gate having a first input coupled to said clock line, a second input coupled to a Q output of said flip-flop circuit, and an output coupled to a clock input terminal of said counter.

* * * * *